United States Patent [19]
Huffman et al.

[11] 4,134,764
[45] Jan. 16, 1979

[54] SEMICONDUCTIVE AND SENSITIZED PHOTOCONDUCTIVE COMPOSITIONS

[75] Inventors: William A. Huffman, Minneapolis; Stephen P. Birkeland, White Bear Lake; Kevin P. O'Leary, Roseville, all of Minn.

[73] Assignee: Minnesota Mining and Manufacturing Company, St. Paul, Minn.

[21] Appl. No.: 743,171

[22] Filed: Nov. 19, 1976

Related U.S. Application Data

[62] Division of Ser. No. 556,400, Mar. 7, 1975, Pat. No. 4,052,209.

[51] Int. Cl.$^2$ ............................................. G03G 5/09
[52] U.S. Cl. ...................................... 96/1.6; 96/1.5 R
[58] Field of Search ...................... 96/1.5, 1.8, 1.7, 1.6; 252/500, 501

[56] References Cited

U.S. PATENT DOCUMENTS

| 3,617,270 | 11/1971 | Kampfer et al. | 96/1.7 X |
| 3,824,099 | 7/1974 | Champ et al. | 96/1.8 X |

Primary Examiner—John D. Welsh
Attorney, Agent, or Firm—Cruzan Alexander; Donald M. Sell; Mark A. Litman

[57] ABSTRACT

Semiconductive compositions are produced by the inclusion of a particular class of dyes into a polymeric binder. When the binder is an organic photoconductive binder, the dyes act as exceptionally good sensitizers for the photoconductive material.

2 Claims, 7 Drawing Figures

FIG. I
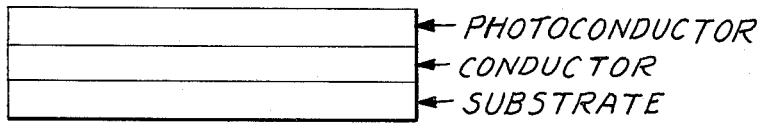
FIG. II
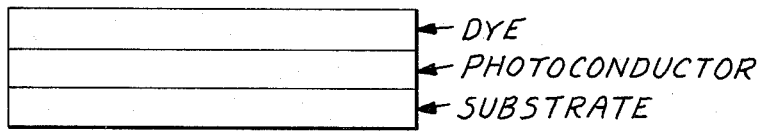
FIG. III
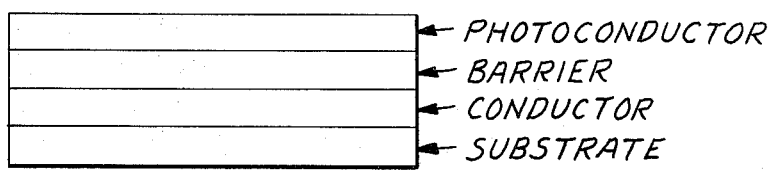
FIG. IV
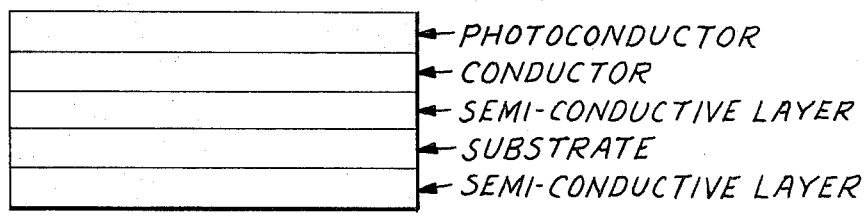
FIG. V
FIG. VI
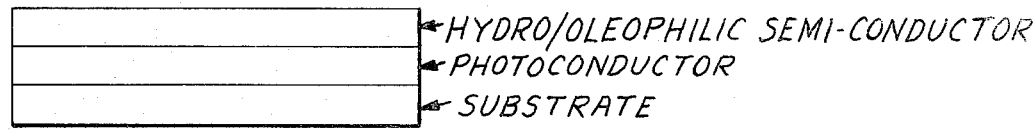
FIG. VII

SEMICONDUCTIVE AND SENSITIZED PHOTOCONDUCTIVE COMPOSITIONS

This is a division of application Ser. No. 556,400 filed Mar. 7, 1975, now U.S. Pat. No. 4,052,209.

Semiconductor materials are electronic conductors whose resistivity at room temperature is between $10^{-2}$ and $10^9$ ohm-cm and in which the electrical charge carrier concentration increases with temperature increases over some temperature range. Important semiconductor materials include silicon, germanium, selenium, cuprous oxide, silicon carbide, lead sulfide, lead telluride, zinc oxide, cadmium sulfide, etc. They are also used in a wide variety of technological areas such as rectifiers, photoconductors, transistors, modulators, detectors, thermistors and solar energy conversion. In general semiconductive materials, and especially semiconductive materials whose electronic properties can be varied, are of significant commercial interest.

All of the presently important semiconductive materials, and all of those used commercially, are inorganic materials. These materials are not generally soluble in organic solvents or in resin binders and carriers. This lack of solubility makes distribution of the semiconductive materials difficult in organic materials. More importantly, the potential agglomeration of the semiconductor particles and the electrical insulation of the particles provided by the binder tends to make semiconductive properties in the composite nonhomogeneous throughout the organic material. The use of organic semiconductor materials which are soluble in conventional polymer solvents, polymer monomers, or polymers would be extremely important in reducing such non-homogeneity.

The ability to formulate semiconductive resins by wet-coating rather than the more tedious and expensive vapor deposition or crystal growing methods would be greatly enhanced if organic semiconductive additives could be found.

Certain semiconductive materials which are normally insulative are known to become conductive when struck by electromagnetic radiation to which the material is sensitive. Such materials are photoconductive. This phenomenon has been used in image or photoreproductive techniques such as the commercial photoconductive process in which (1) a photoconductive layer having a conductive backing is electrostatically charged, (2) the charged layer is selectively exposed to an image of intense radiation (e.g., a mercury vapor lamp) which alters the conductive properties of the layer in light struck areas, (3) the change in the photoconductive properties (from insulative to conductive) enables the electrostatic charge to discharge through the photoconductive layer to the conductive backing while the charge is maintained in areas not struck by radiation, so that (4) colored particles (toner particles) which are capable of being permanently affixed are dispersed over the surface of the partially discharged photoconductive surface where the particles are attracted or repelled (according to the charge of the particles, neutral, positive or negative) in non-imaged areas, and (5) then the particles are either permanently affixed to the surface by heat, solvent, and/or pressure, or are transferred to a receptor element and permanently affixed.

(6) Both the photoconductive layer and the receptor layer may be either transparent or opaque to visible radiation, however, if the resultant imaged layer is intended for projection purposes, the final imaged layer must of course be transmissive of visible radiation.

There are a number of problems which must be overcome in order to make such photoconductive systems operate more efficiently. Present systems are relatively insensitive when compared to other commercial imaging systems (such as silver halide photographic systems) and require high intensity radiation for the exposure step. Photoconductive materials now in use also have a very limited range of sensitivity in the electromagnetic spectrum further reducing the efficiency of photoconductive systems.

It is therefore one aspect of the present invention to show additives to binder materials which can effect semiconductive properties to those binders.

It is a further aspect of this invention to show additives to organic, synthetic, polymeric binders which can effect semiconductive properties to those binders.

It is one other aspect of the present invention to reduce the impact of these problems on photoconductive systems by novel design of photoconductive elements and novel active compounds contained in those elements.

It is a further aspect of this invention to disclose the use of certain classes of dyes to sensitize photoconductive elements and to extend the range of sensitivity for such elements to the electromagnetic spectrum.

These and other aspects of the present invention will be apparent from this technical disclosure.

The semiconductive and photoconductive art has recognized these problems. Many different materials have been suggested as semiconductive additives or sensitizers for photoconductive systems (see U.S. Pat. No. 3,037,861, June 5, 1962), but the sensitizers used to date have not significantly reduced the sensitivity problems of photoconductive systems and the additives have not greatly improved semiconductive materials. Neither the range of sensitivity nor the speed of such sensitized elements has been altered to the extent accomplished in the practice of this invention. Furthermore, with the increased sensitivity of photoconductive elements in the practice of this invention, novel structures and novel utilities can be found for photoconductive elements which allow their use, for example, in xerographic processes, Magne-dynamic and other electrostatic processes.

In order to manufacture a semiconductive element according to the practice of this invention, a limited class of dyes must be added to any binder material.

These are a variety of different constructions which can be used for photoconductive elements depending upon the particular properties and response required from the element. At a minimum, of course, there must be a binder material. In general, these are organic polymeric materials of high dielectric strength such as polyvinyl toluene, polystyrene, poly-halostyrene and copolymers thereof, polyvinyl toluene and substituted PVT - butadiene copolymers, polyacrylates and copolymers thereof, epoxy resins, polycarbonate resins. A particularly useful class of binders are the organic photoconductors such as poly-N-vinyl carbazole, polyanthracene polyvinylacenaphthalene, poly 2,9-methylene fluorene polyvinyl ferrocene, polybenzocarbazole, polybenzoanthracene. In the practice of this invention, the photoconductive layer(s) must be associated with the improved classes of sensitizing dyes, but the structure of many elements will remain otherwise the same as those conventionally used in the art.

The FIGS. (I-VII) illustrate various physical constructions which are contemplated for the photoconductive elements of the present invention.

FIG. I shows a photoconductive element comprising a photoconductive layer superposed on a substrate (In this construction, the substrate must have some conductive properties which would enable discharge upon light exposure of the photoconductive layer).

FIG. II shows a photoconductive element respectively comprising a substrate, conductor layer, and photoconductive layer respectively.

FIG. III shows a photoconductive element respectively comprising a substrate, photoconductor and sensitizing dye containing layer. This construction differs from that of FIG. II in that the dye and photoconductive materials are separated, the manner of application of the dye layer (e.g., coating with a solution of the dye) is such that the dye does not penetrate into the photoconductive layer.

FIG. IV shows a photoconductive element respectively comprising a substrate, conductor layer, barrier layer and photoconductive layer. The barrier layer provides protection between the photoconductive layer and conductive layer where those layers may be reactive with each other or where reduced conductivity and increased dielectric strength is desired in the element.

FIG. V shows a photoconductive element respectively comprising a substrate, semi-conductive layer, conductor layer and photoconductive layer. This configuration may also have a second semi-conductive layer on the reverse side of the substrate. The first semi-conductive layer may act both to increase adhesion and to increase the efficiency of charge dissipation in the photoconductive layer. The second semi-conductor layer decreases the likelihood of charges developing on the substrate backside especially in reproductive processes where both sides of the element are charged.

FIG. VI shows a photoconductive element respectively comprising a piezo/pyroelectric polymer layer, a photoconductor layer, and a conductor layer.

FIG. VII shows a photoconductive element respectively comprising a substrate, photoconductor layer and a hydro/oleophilic semi-conductor layer. This construction is suitable for use as the element in an electrostatic printing process. In the imaged film, the areas in which the toner powder is fused would act as the ink receiving substrate, resulting in a lithographic plate.

These and other physical embodiments of the present invention will be understood from this disclosure.

The photoconductive layers utilized in the practice of this invention are preferably organic, polymeric, polynuclear thermoplastic resins and their copolymers (e.g., poly(N-vinyl carbazole) or a vinyl carbazole/vinyl acetate copolymer) and the sensitizing dyes used in the practice of this invention. Other sensitizing dyes known in the art (such as those disclosed by German Pat. No. 1,068,115) may be used, as well as other additives known to the useful in photoconductive constructions such as film improving agents (e.g., plasticizers, adhesion promoters, hardeners, and other thermoplastics such as epoxy resins and polycarbonates), organic acids to enhance color image formation by oxidation of leuco dyes (e.g., bis(trifluoromethyl-sulfonyl-methane)), photohalogens (e.g., tristribromo-s-triazene), and Lewis acids to aid conduction.

The conductor layer can essentially be any layer of material with conductive properties such as a metal coating (e.g., Al, Cu, Ag, Cr, etc.), inorganic metal oxide (e.g., iron oxides, indium oxide, stannous oxide), an inorganic salt (e.g., copper iodides), and electroconductive resins (including particulate-filled resins), such as the polyvinylbenzene pyridium chlorides (c.f. Italian Pat. No. 767,082, Issued May 15, 1967 and Italian Pat. No. 801,584, Issued Feb. 1, 1968) and sulfonated polyvinyl toluenes.

The substrate in most constructions can be any support material such as paper, thermoplastic resin (polyesters, acetates, vinylchlorides, polycarbonates, etc.), polymer matrix, etc. The substrate may be insulative or conductive, with a high or low dielectric constant depending upon the particular imaging process.

It has been found in the practice of this invention that certain dye materials contribute semiconductive properties to binders and have outstanding characteristics when used as sensitizers for photoconductive materials. The generic class of dyes used in the practice of this invention have been found to generally provide outstanding properties, particularly those as are required by sensitizers: low half voltage - photo decay time, useful solubility range in conventional solvents, high quantum efficiency as an active sensitizer, broad sensitizing range extending out to the infrared, and high charge acceptance.

The dyes useful in the practice of this invention are three or four membered carbon rings or ethylenic groups (i.e., $+C\!\!=\!\!C+$) having at least two quinoid benzene rings bonded thereto, with all remaining ring carbons having valences satisfied as part of a carbonyl moiety.

The term quino-, and quinoid benzene as used in the practice of this invention refers to a quinoid ring having one exocyclic double bond satisfied by an oxygen (i.e.,

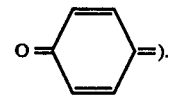

).

These quino groups bonded to the three and four membered rings and ethylenic groups may bear substituents no more electron withdrawing than chlorine in positions ortho to the quinoid benzene carbonyl group (i.e., substituents $X_1$ and $X_2$ may be independently positioned only as shown below):

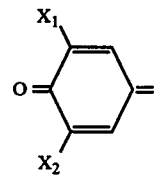

wherein $X_1$ and $X_2$ are groups no more electron withdrawing than chlorine.

One or two position substituents no more electron-withdrawing than chlorine may be present. Such substituents on the quinoid benzene group for example include alkyl and alkoxy (straight or branched, preferably having $C_1$-$C_{20}$ groups), phenyl, phenoxy, halophenyl, $C_1$-$C_{10}$ alkyl and alkoxy substituted phenyl, halo-substituted straight and branched alkyl (having no more than one halo atom per carbon atom), amino, iodo, bromo, chloro, carboxyl, carbamyl, and amido groups. All such compounds having substituents no more electronwithdrawing than chloro can be made as known in the art by later referenced processes by Dr. R. West et al. Preferably no more than a total of 60 atoms should be in these groups for convenience, and most preferably no more than 20 atoms. The use of the term quino- or quinoid benzene in this specification with reference to compounds in the practice of this invention includes both substituted (as limited by the above definition) and unsubstituted groups. Although these substituents do not operatively affect the ability of the compounds to function as described, they are not totally inactive groups. The substituents can serve to provide stability to the compound by preventing unwanted reduction of the quinoid group and also to improve solubility of the dye (e.g., long chain hydrocarbon groups for better non-polar solvent solubility, and polar groups for better polar solvent solubility). The dyes themselves are preferably used in concentrations in normal coating solvents of $0.5 \times 10^{-6}$ moles of dye per mole of photoconductor up to the solubility limit of the dye. When used as a semiconductor additive, whatever concentration of dye in the binder is effective for the purpose intended is the required amount. At a minimum, a concentration of dye which alters the conductive properties of the binder without dye by 20% would be an effective amount.

It is furthermore generally preferred in the ortho substituents to have no more than 20 carbon atoms and no more than 4 heteroatoms in the substituent group.

The dyes may alternatively represented by the following formulae:

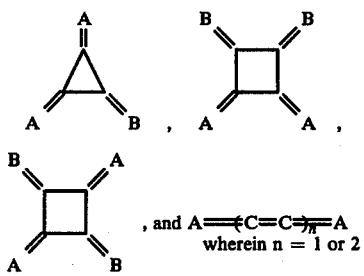

wherein $n = 1$ or $2$ wherein A is a quinoid benzene group, and B is either a quinoid benzene group or an oxygen atom.

The preparation of these dyes may be found for example in numerous articles published by Dr. Robert West and his associates at the University of Wisconsin. These articles include "Triarylcyclopropenium Ions and Diarylcyclopropenones from Trichlorocyclopropenium Ion", Robert West et al., J.A.C.S., Vol. 92, No. 1, Jan. 14, 1970, pp. 149-154; "Diquinocyclopropenes and Triquinocyclopropanes", Robert West et al. J.A.C.S., Vol. 92, No. 1, Jan. 14, 1970, pp. 155-161; "Synthesis of a Diquinocyclopropanone and a Diquinoethylene", Robert West et al., J.A.C.S. 89:1, January, 1967, p. 153, and "Triquinocyclopropanes", Robert West et al., J.A.C.S. 88:6, p. 11.

A further description of the present invention is provided by the following examples.

EXAMPLE I

One gram of polyvinylcarbazole (PVK) was dissolved in chlorobenzene to make a 10% by weight solution. 4 mg hexa(t-butyl)triquinocyclopropane (TQCP) was added to the solution to provide a ratio of 4 mg dye/1g PVK The solution was knife-edge coated on ½ mil aluminum foil and oven dried at 50° C. for 10 min. The coated aluminum was corona charged in the negative mode, imagewise light exposed, and immersed in a liquid developer consisting of a non-polar hydrocarbon medium such as kerosene having dispersed therein pigments of #4852 Zulu Blue 818-026-16 (from Harshaw Chemical Co.). The element was removed after a short period of time and a high quality, high definition positive reading colored image was observed.

EXAMPLE II

Hexa(t-butyl)triquinocyclopropane (TQCP) was added to a 10% solution of polyvinyl carbazole in chlorobenzene to make a 0.1% by weight TQCP solution. To one half of this solution was further added 5 mg tris-tribromomethyl-s-triazine and the resulting solution coated in a thin layer about 10 $\mu$ thick on a conductive base (metal filled thermoplastic), and oven dried as above. The remaining half was coated on a similar base and dried similarly. Measurements of photo induced charge decay were taken from samples negatively electrostatically charged and exposed to a 15 foot candle light source. Residual voltage after 10 sec. without the triazine compound was 100 volts while only 10 volts with the triazine which evidences that free halogen compounds enhance photodecay with the dyes of this invention.

EXAMPLE III

To a 20% by weight solution of polyvinylcarbazole in an 80/20 by weight blend of chlorobenzene/1,2-dichloroethane was added sufficient octa(t-butyl)-tetraquinocyclobutane to provide a ratio of 5 mg dye/gram of polyvinyl carbazole. The solution was coated on a conductive support and dried. The sample was placed in the following equipment for testing its efficiency as a photoconductor.

1.0 inch diameter discs are punched out of the photoconductive samples and inserted into the receiving elements of an electrostatic voltmeter such as MK Systems Model 169C "Stati-Tester" which electrostatically charges, allows dark decay, exposes the element to light, and measures the photoresponse and records it on a two-dimensional abscissaordinant graph. Both negative and positive charging and dark current measurement time for predetermined periods may be obtained. Illumination is at an intensity of 15 fc for a predetermined period of time. Such apparatus provides measures of retained charge at any time in the sequence of physical steps and thus measures all changes in the charge during the process.

The above sample produced the following results with a 10 sec. negative corona charge, 5 sec. dark decay time, and 10 sec. exposure to tungsten light at 15 foot candles:

500 volts accepted charge
20 volts dark decay
0.45 seconds to ½ voltage
1.0 seconds to 1/50 voltage (10V residual)

EXAMPLE IV 2.0 mg hexa-t-butyl triquinocyclopropane was added to a solution of 1.0 g polyvinyl carbazole dissolved in 9.0 grams of 80/20 chlorobenzene/1,2-dichloroethane. This was coated 2.5 mil wet onto the aluminum surface of a conductive support film consisting of a 3 mil polyester film vapor coated with aluminum. On top of the photoconductive layer a very thin coating of an acid sensitive leuco dye dissolved in polyvinyl chloride-vinyl acetate copolymer was applied. The transparent construction was then negatively charged, image exposed to a tungsten light source, and immersed in a developer consisting of dispersed particles of salicylic acid. The acid adheres to the image in the charged area, and upon heating a colored positive image results.

EXAMPLE V

Ten (10) grams of poly-N-vinylcarbazole was dissolved in ninety (90) grams of an 80/20 by volume solution of chlorobenzene and 1,2-dichlorethane. To this solution was added 500 mg of hexa-isopropyl-triquinocyclopropane. The resulting deep green solution was knife-edge coated to a thickness of about 25 microns onto a 1.5 mil aluminum sheet subcoated with a sulfonated polyester ("WD" Size manufactured and sold by Eastman Kodak as an adhesion promoter for polyvinylcarbazole film). This coating was evenly dried in a warm air oven for 10 minutes at 50° C. under forced air to remove the solvent. The film was cut into different samples and tested for photoresponse in an electrophotographic mode and provided the following data when negatively corona charged with 100 ma for 10 seconds with a 5 second dark decay time and 15 foot candles/second with a tungsten filament source at 2850° K.:

accepted charge: 650 volts
dark decay: 50 volts
time to half voltage: 0.30 seconds
time to 50 volts (in fcs): 0.75 seconds
residual voltage after 10 secs: 0 volts Because of the low residual charge, the composite shows the utility of the construction as an endless belt in an electrophotographic copy apparatus.

The following examples investigate the semiconductive properties of the dyes of this invention when added to any binder material. Controls of the binder material, in film form, were compared with samples of binder further containing the dyes of the present invention.

Sample and control coatings of the binders were tested for photoconduction and semiconduction by investigation of the bulk and surface direct current conductivity in both the light exposed and dark states. Both a tungsten light source and infrared radiation source were used as sources of electromagnetic radiation. Measurements of current during light exposure ($I_L$) and during dark state ($I_D$) were taken. A value of $I_L/I_D$ greater than one (1.00) conclusively shows semiconductive or photoconductive properties.

In the following examples an applied field of $10^4$ volts/cm was used along with a 100 watt tungsten lamp and 250 watt infrared lamp.

EXAMPLES VI–XIII

The following procedures were used in making all samples used in these examples. The described polymers were dissolved in chlorobenzene to form a 10% by weight solution. The described amounts of additives, if any, were thoroughly mixed into the solution which was then spin-coated onto a 4 mil polyester film having a vapor deposited aluminum film thereon. The coatings in all cases were about 1.0 mil thick.

SAMPLE COMPOSITIONS MADE WERE:

VI. Polymethylmethacrylate (control)

VII. Polymethylmethacrylate and 0.5% tetraphenyl-p-phenylenediamine (a monomeric electron donor)

VIII. Polymethylmethacrylate, 0.4% hexa-t-butyl triquinocyclopropane, and 0.4% tetraphenyl-p-phenylenediamine.

IX. Polyvinyltoluene-butadiene copolymer (control)

X. Polyvinyltoluene-butadiene copolymer and equimolar amount of hexa-t-butyl triquinocyclopropane.

XI. Polyvinyltoluene-butadiene copolymer and 0.5% tetraphenyl-p-phenylenediamine by weight of polymer.

XII. Polyvinyltoluene containing $5 \times 10^{-4}$ moles hexa-t-butyl triquinocyclopropane per gram of monomer.

XIII. Polyvinyltoluene containing $5 \times 10^{-4}$ moles of both hexa-t-butyl triquinocyclopropane and tetraphenyl-p-phenylenediamine.

All measurements were made through the bulk of the sample material, and the results are recorded below.

|  | SAMPLE | LIGHT | $I_L/I_D$ | log $I_D$ |
|---|---|---|---|---|
| (control) | VI | tungsten | 1.00 | −12 |
|  |  | infrared | <1.00 | −12 |
| (control) | VII | tungsten | 1.00 | −12 |
|  |  | infrared | 1.06 | −12 |
| (control) | IX | tungsten | 1.00 | −13 |
|  |  | infrared | 1.03 | −13 |
| (control) | XI | tungsten | 1.00 | −10 |
|  |  | infrared | 1.00 | −10 |
|  | XIII | tungsten | 1.11 | −10 |
|  |  | infrared | 1.14 | −10 |
| X |  | tungsten | 1.69 | − 8 |
|  |  | infrared | 1.55 | − 8 |
| XII |  | tungsten | 2.08 | −10 |
|  |  | infrared | 2.17 | −10 |
| XIII |  | tungsten | 3.34 | −10 |
|  |  | infrared | 2.67 | −10 |

The above data show that the addition of dyes of the present invention to binder materials creates semiconductive or photoconductive properties therein (in polymethylmethacrylate and polyvinyltoluene-butadiene copolymer examples) or substantially increases the usefulness of those properties when already extant in the binder (with the polyvinyl toluene example). This supports the generic utility of binders containing the dyes recited in the practice of this invention.

EXAMPLE XIX

One gram of poly-N-vinylcarbazole was dissolved in nine grams of an 8/2 by weight solution of chlorobenzene and 1,2-dichloroethane. To this solution 5.0 mg diquinoethylene was added with stirring until dissolved. The composition was knife-edge coated as a thin film of about 25μ onto a polyester film coated with a commercially available, transparent, conductive polymeric resin (ECR-34, manufactured by DOW Chemical Co.). The photoconductive composition was oven dried evenly at 50° C. for 5 minutes. Measurements of photo decay and photoconductivity were taken as above, and the half voltage photo decay was recorded at 15 foot-candle seconds.

What we claim is:

1. An article comprising semiconductive composition comprising a polymeric binder which is not an organic, photoconductive, polymer binder and a dye comprising at least two quinoid benzene rings linked through a bridging moiety selected from the group consisting of cyclopropane, cyclobutane and $(C{=}C)_n$, wherein $n$ is 1 or 2, and wherein any ring carbons of the cyclopropane and cyclobutane bridging moieties not directly bonded to quinoid benzene rings are bonded to oxygen atoms to complete a carbonyl group said dye being present in sufficient concentration so that the conductive properties of the semiconductive composition differ by at least 20% from the conductive properties of said binder without said dye coated onto an organic photoconductive binder layer which has been coated onto a substrate.

2. The article of claim 1 wherein said polymeric binder is an organic photoconductive binder.

* * * * *